April 30, 1968 G. E. JAMISON 3,381,184

LEAD TERMINATION STRUCTURE

Filed Jan. 28, 1966

INVENTOR.
GEORGE E. JAMISON

BY

OSTROLENK, FABER, GERB & SOFFEN

ATTORNEYS

United States Patent Office 3,381,184
Patented Apr. 30, 1968

3,381,184

LEAD TERMINATION STRUCTURE

George E. Jamison, Los Angeles, Calif., assignor to International Rectifier Corporation, El Segundo, Calif., a corporation of California Filed Jan. 28, 1966, Ser. No. 523,638
3 Claims. (Cl. 317—234)

ABSTRACT OF THE DISCLOSURE

A conductor extending from a semiconductor device extends through a tube sealed to a hermetically sealed casing. The tube is crimped on the lead and a lead-receiving opening is punched through the crimped section.

This invention relates to a novel lead construction and method for its formation, and more specifically relates to a novel manner for forming a hermetically sealed lead termination structure having an aperture therein which provides for convenient lead connection.

In the manufacture of hermetically sealed devices such as semiconductor diodes, it is common practice to prefabricate the semiconductor wafer and conductive base therefor with a lead extending from the wafer which is subsequently to be hermetically enclosed by a hermetic sealing housing.

In the past, the hermetic sealing housing has included a thin extending tube which receives, at the lower portion thereof, the lead extending from the semi-conductor wafer. In order to electrically connect and hermetically seal the housing structure and thin tube about this extending lead, the tube has been crimped at an intermediate portion thereof with the remaining portion of hole formed therein to serve as a convenient means to receive an electrical connection. Alternatively, the upper end of the hermetically sealing tube could receive a further flexible conductor therein which is also crimped and sealed to the tube. With such arrangements, it was found that after temperature cycling, the crimps would loosen to increase the resistance of the electrical connection and to defeat the hermetic seal.

The principle of the present invention is to extend the internal lead extending from the semiconductor wafer so that it extends for substantially the full length of the tube in the hermetic sealing housing. Thereafter, a single crimping and punching operation first crimps and seals the outer tube to the inner lead and thereafter punches a hole through the compressed assemblage of the internal lead and external tube. Thus, a superior hermetic seal has been found to be created about the internal lead, and the direct punching of the hole through the compressed assembly permits a simplification in the manufacturing process of the device in that both the crimping and punching can be accomplished in the same step. Moreover, the arrangement of the invention forms a seal which does not come under temperature cycling and permits the use of a thinner wall tube and a heavier or thicker internal lead.

Accordingly, a primary object of this invention is to provide a novel diode lead termination structure.

Yet another object of this invention is to provide a novel lead termination arrangement wherein a hermetic sealing tube receives an internal lead along substantially its full length with one end of the assemblage being crimped flat and an opening formed directly through the compressed assemblage of external tube and internal lead.

Yet another object of this invention is to provide a novel method for the formation of a diode lead termination.

These and other objects of this invention will become apparent from the following description when taken in connection with the drawings, in which.

Figure 1:
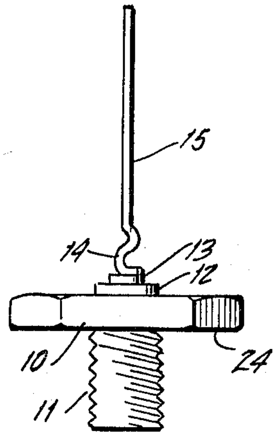
FIGURE 1 is a side plan view of the stud, wafer and inner lead subassembly of a typical diode to which the invention may be applied.
Figure 2:
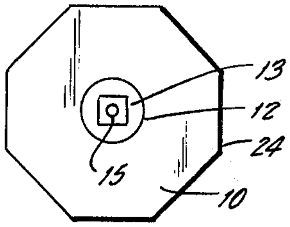
FIGURE 2 is a top view of FIGURE 1.

Referring first to FIGURES 1 and 2, there is illustrated therein a typical subassemblage used for a rectifier diode which includes a conductive stud 10 which may have a hexagonal flange 24, a threaded base 11 and a mounting pedestal 12. A wafer 13 which may be of silicon having a rectifying junction therein is suitably secured upon pedestal 12 with the stud 10 serving as one terminal for the wafer. The opposite surface of the wafer, and thus its other terminal, is then connected to the cat-whisker 14 of internal lead 15, this complete subassemblage being preformed and secured together prior to the hermetic sealing of the wafer 13. Preferably, and in accordance with the invention it has been found useful, in the case of high current rating devices, to insert a relatively heavy conductive wafer **14*a* between cat-whisker 14 and wafer 13**.

Figure 3:
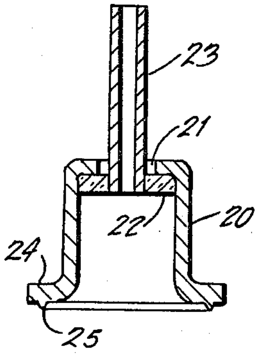
FIGURE 3 is a side cross-sectional view of the hermetic sealing housing which is assembled with the structure of FIGURE 1 to hermetically seal the wafer mounted on the stud.
Figure 4:
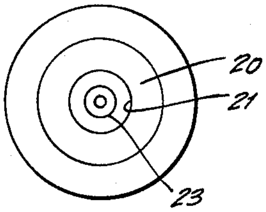
FIGURE 4 is a top view of FIGURE 3.

In order to hermetically seal wafer 13, a sealing housing is provided which is best shown in FIGURES 3 and 4 for the so-called top-hat variety of diode and includes a metallic body 20 having an opening 21 at the top thereof in which a suitable dielectric bead 22 is embedded. The dielectric bead 22 which may be of a suitable ceramic or glass then receives a hollow, conductive external tube 23. The bottom of housing 20 is then formed as a flange 24 which has an annular welding ring 25 extending from its lower surface.

In the prior art arrangement of this type diode, it was the usual practice that the external conductive tube 23 of the sealing housing of FIGURES 3 and 4 was sufficiently long that the internal lead 15 of FIGURE 1 extending from wafer 13 was received only in the bottom portions of the conductive tube although, in some cases, a longer internal lead has been used. In order to electrically connect and complete the hermetic seal about wafer 13, it was the practice to crimp at a centrally located portion along tube 23 which was low enough to receive the end of conductor 15 and, in some cases, this crimp was extended along to the top of the external lead 23. Thereafter, and in those devices using a relatively short internal lead, an opening was formed in the upper end of conductor 23 which provided a convenient means for inserting an electrical conductor to be connected to the device.

This prior art arrangement had the disadvantage that leaks could develop in the crimped area between the lead 15 and external tube 23, and generally required a relatively long crimp and thus a long output lead section. Moreover, the system frequently required the use of a two-step process in the crimping and punching of the opening.

In accordance with the present invention, the lengths of lead 15 and tube 23 are made such that after the assemblage of the housing of FIGURE 3 and the stud of FIGURE 1, the lead 15 will extend along the full length of tube 23 with a single crimp and punch operation forming a secure hermetic seal and forming a convenient opening for connection of the lead to the diode terminal.

It has been found that with this arrangement the previously existing inadvertent leaks in the hermetic seal have been alleviated, because the punching operation through the compacted lead and external tube further serves to enhance the sealing effect. Moreover, with this arrangement, it is found that the lead length can be reduced since a longer length to insure a good hermetic seal was no longer needed.

Referring now to FIGURES 5 through 8, FIGURE 5 illustrates the assembly of the units of FIGURES 1 and 3 wherein the housing of FIGURE 3 is slid over the lead 15 with the lead 15 entering the interior of tube 23. It has been found that a tight fit between the external diameter of lead 15 and internal diameter of tube 23 is not necessary, and a clearance of the order of 10 mils is permissible without affecting the integrity of the hermetic seal. Thereafter, the flange 24 is welded to the stud 10 over the welding ring 25 to form the first portion of the hermetic seal and to mechanically secure the subassemblies of FIGURES 1 and 3 together.

Figures 5, 6, 7:
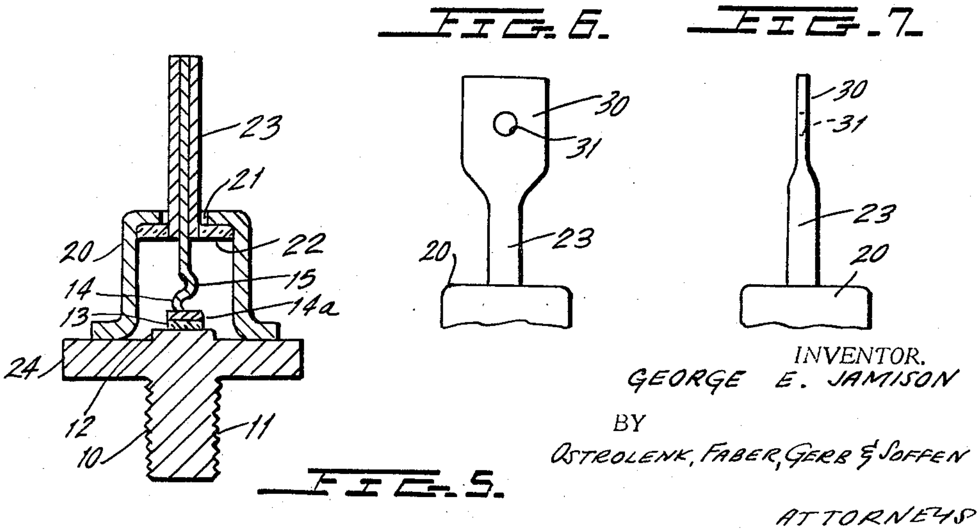
FIGURE 5 is a side cross-sectional view of the assemblage of the subassemblies of FIGURES 1 and 3 with the bottom flange of the sealing housing of FIGURE 3 welded to the stud of FIGURE 1.
FIGURE 6 is a side plan view of the upper lead structure of FIGURE 5 after crimping and punching in accordance with the invention.
FIGURE 7 is a side view of FIGURE 6.

It should be noted in FIGURE 5 that the internal lead 15 extends completely along the length of tube 23 and terminates at the end of tube 23.

In a typical embodiment of the invention, the diameter of tube 23 has been approximately 2 mm., and has a wall thickness of approximately 1/2 mm. The length of the tube 23 extending beyond the upper surface of housing 20 has been approximately 11 mm. prior to the crimping operation.

Note that in the prior art subassemblies this length was necessarily substantially longer than 11 mm.

Figure 8:
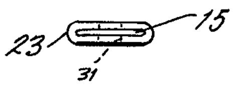
FIGURE 8 is a top view of the end of the crimp of FIGURES 6 and 7 and illustrates the compacting of the inner lead of FIGURE 1 and outer surrounding tube of FIGURE 3.

Thereafter, and as shown in FIGURES 6, 7 and 8, the upper end of tube 23 and lead 15 is simultaneously crimped and punched, thereby to form the crimp section 30 having the opening 31 therein.

In the crimping operation, the lead is typically flattened out to approximately 3½ mm. with the length of the crimp being approximately 5 mm. and the total length of the lead extending beyond housing 20 being of the order of 8 mm.

The compacting action is best illustrated in FIGURE 8 wherein the flattening of both internal lead 15 and external tube 23 is illustrated with the opening 31 extending through this compacted or crimped mass. As previously indicated, by punching the opening through the crimped assemblage, the integrity of the hermetic seal formed between external tube 23 and internal lead 14 is substantially enhanced.

Although this invention has been described with respect to its preferred embodiments, it should now be understood that many variations and modifications will be obvious to those skilled in the art, and it is preferred, therefore, that the scope of the invention be limited not by the specific disclosure herein, but only by the appended claims.

The embodiments of the invention in which an exclusive privilege or property is claimed are defined as follows:

1. A hermetically sealed housing structure for semiconductor devices; said housing structure including a first and second subassembly; said first subassembly comprising a conductive stud having a generally flat upper surface and a semiconductor wafer; said semiconductor wafer secured along one surface thereof to said generally flat surface; said generally flat surface extending beyond the periphery of said semiconductor wafer and a lead wire secured to the opposite surface of said semiconductor wafer and extending therefrom for a predetermined length; said second subassembly comprising a cylindrical metallic housing structure having an opening at the first and second ends thereof, an insulation bead connected across said first end of said metallic housing structure, a hollow metallic tube connected within said insulation bead and extending outwardly therefrom and away from said metallic housing structure and insulated therefrom; said second end of said metallic cylinder connected to said generally flat surface around a periphery spaced from said wafer; said lead wire extending into said metallic tube along the full length of said tube; said metallic tube crimped at the end thereof into engagement with said lead wire to substantially compact a crimp section of homogeneous metallic cross-section to define a hermetic seal; and an opening extending through said compacted crimp section.

2. The device substantially as set forth in claim 1 wherein the length of said tube, after crimping, is approximately 11 millimeters from the surface of said insulation bead.

3. The device substantially as set forth in claim 1 wherein said lead wire secured to said semiconductor wafer has a cat-whisker connector structure; and a conductive wafer interposed between said cat-whisker connector structure and said semiconductor wafer.

References Cited

UNITED STATES PATENTS 3,274,456 9/1966 Pittler et al. -------- 317—234

JOHN W. HUCKERT, *Primary Examiner.*

J. R. SHEWMAKER, *Assistant Examiner.*